(12) United States Patent
Fornes et al.

(10) Patent No.: US 8,142,687 B2
(45) Date of Patent: Mar. 27, 2012

(54) METHOD FOR PRODUCING HETEROGENEOUS COMPOSITES

(75) Inventors: Timothy D. Fornes, Apex, NC (US); Nicolas D. Huffman, Raleigh, NC (US)

(73) Assignee: Lord Corporation, Cary, NC (US)

( * ) Notice: Subject to any disclaimer, the term of this patent is extended or adjusted under 35 U.S.C. 154(b) by 0 days.

(21) Appl. No.: 12/941,661

(22) Filed: Nov. 8, 2010

(65) Prior Publication Data

US 2011/0049416 A1 Mar. 3, 2011

Related U.S. Application Data

(63) Continuation of application No. 12/055,789, filed on Mar. 26, 2008, now abandoned.

(60) Provisional application No. 60/896,961, filed on Mar. 26, 2007.

(51) Int. Cl.
*H01B 1/00* (2006.01)

(52) U.S. Cl. .......... 252/500; 252/79; 252/513; 524/773; 524/780

(58) Field of Classification Search .......... 252/514, 252/519.33, 79, 500, 513; 257/712; 523/400, 523/458; 524/107, 773, 780; 560/25
See application file for complete search history.

(56) References Cited

U.S. PATENT DOCUMENTS

| | | | |
|---|---|---|---|
| 4,002,599 A | 1/1977 | Graham | |
| 5,106,538 A | 4/1992 | Barma et al. | |
| 5,286,417 A * | 2/1994 | Mahmoud et al. | 252/519.33 |
| 5,376,403 A | 12/1994 | Capote et al. | |
| 5,575,956 A | 11/1996 | Hermansen et al. | |
| 5,716,663 A | 2/1998 | Capote et al. | |
| 5,830,389 A | 11/1998 | Capote et al. | |
| 5,853,622 A | 12/1998 | Gallagher et al. | |
| 5,929,141 A * | 7/1999 | Lau et al. | 523/458 |
| 5,948,533 A | 9/1999 | Gallagher et al. | |
| 6,060,539 A | 5/2000 | Hermansen et al. | |
| 6,599,446 B1 | 7/2003 | Todt et al. | |
| 6,791,839 B2 | 9/2004 | Bhagwagar | |
| 6,888,257 B2 | 5/2005 | Wilson et al. | |
| 7,083,850 B2 | 8/2006 | Rasiah | |
| 2001/0018477 A1 * | 8/2001 | Kumakura | 524/107 |
| 2001/0053863 A1 * | 12/2001 | Schultz et al. | 560/25 |
| 2004/0000712 A1 * | 1/2004 | Wilson et al. | 257/712 |
| 2004/0191501 A1 | 9/2004 | Rasiah | |
| 2007/0131912 A1 | 6/2007 | Simone et al. | |

OTHER PUBLICATIONS

Yang Rao, Ke Tang, C.P. Wong, A Study on Epoxy-Based High K Composite For Embedded Capacitor With Silver Fillers Coated Self Assembly Monolayer Insulating Materials, Electronic Components and Technology Conference, 2003, pp. 1820-1822.

* cited by examiner

*Primary Examiner* — Khanh Tuan Nguyen
(74) *Attorney, Agent, or Firm* — Todd W. Galinski

(57) ABSTRACT

A method for selecting materials and processing conditions to prepare a heterogeneous structure in situ via the reaction of a homogeneous mixture of a reactive organic compound and a filler, which may then optionally be sintered. The method is employed to provide a heterogeneous composite possessing exceptionally high thermal and/or electrically conductivities for a given concentration of conductive filler. The choice of materials as well as processing conditions employed, as will be described below, have a strong effect on the rate domain formation/heterogeneity of the structure formed, the extent of filler particle-particle interactions within filler-rich domains, and ultimately the thermal and/or electrical conductivity. Proper choice of these conditions can lead to composites having enhanced properties at a reduced bulk filler concentration.

30 Claims, 11 Drawing Sheets

METHOD FOR PRODUCING HETEROGENEOUS COMPOSITES

CROSS REFERENCE

This application is a Continuation Application of, claims the benefit of, and incorporates by reference, U.S. patent application Ser. No. 12/055,789, filed Mar. 26, 2008 now abandoned, which claims the benefit of and incorporates by reference U.S. Provisional Patent Application No. 60/896,961 filed on Mar. 26, 2007 with the United States Patent and Trademark Office.

FIELD OF THE INVENTION

The present invention relates to a method for creating heterogeneous polymer-filler composites in situ via a reaction of a homogeneous mixture of a filler and a reactive organic compound. The heterogeneous structure comprises highly filler-rich areas whose concentration is greater than that of the bulk filler concentration.

BACKGROUND OF THE INVENTION

Electrically conductive polymer composites often consist of electrically insulating polymers filled with electrically conductive fillers. Such fillers often consist of metal- or carbon-based fillers often in the form of flake or fibers. In order to make the composite conductive, the fillers are added to the point a critical filler concentration is reached at which the composite changes from electrically insulating to electrically conducting. This concentration, termed the percolation threshold, is associated with a continuous electrical pathway formed from the touching or "percolation" of conductive filler particles. Beyond this threshold, the electrical conductivity can be further improved by addition of filler to the polymer matrix. The ultimate conductivity beyond the threshold will depend on the type of filler used and the maximum obtainable filler loading before tradeoffs in other composite properties becomes unacceptable from an application standpoint Electrically conductive polymer composites are commonly used for such applications requiring electromagnetic shielding, electrostatic discharge, or high conductivity for device interconnects or circuitry. The type of application will dictate the ultimate conductivity needed which will dictate the type and concentration of conductive fillers used in the composite material. In many instances the level of filler required leads to undesirable sacrifices in other important physical characteristics of the composite, such as dispense viscosity, adhesion, impact strength, among other things. In some instances, the cost of the filler is a limiting factor, particular for such fillers as gold, silver, or carbon fibers. It would be thus desirable to achieve high levels of electrically conductivity with minimal loss in polymer attributes.

In the area of thermally conductive applications, surface mounting of electronic composites via interface adhesives is well developed in automated package assembly systems. Such adhesives are used in several approaches to provide lid attach, sink attach and mainly thermal transfer from flip chip devices, as well as against mechanical shock and vibration encountered in shipping and use. As semiconductor devices operate at higher speeds and at lower line widths, the thermal transfer properties of the adhesive are critical to device operation. The thermal interface adhesive must create an efficient thermal pathway between the die or lid and the heat sink as the adhesive itself due to interface resistance and bulk resistance is typically the most thermally resistant material in the die-adhesive-lid-adhesive-sink or die-adhesive-sink configuration. The thermal interface adhesive must also maintain efficient thermal transfer properties through reliability testing which simulates actual use conditions over the life of the device. Moreover, a suitable adhesive must have certain fluid handling characteristics, and exhibit specific adhesion, controlled shrinkage, and low corrosivity in order to provide long term defect-free service over the thermal operating range of the electronic circuit package.

As with traditional electrical applications mentioned above, interface adhesives having high bulk thermal conductivities are often made by adding large levels of thermally conductive filler to the reactive organic resin. In many instances, undesirable increases in viscosity occur to the point handling (or dispensing) becomes an issue which often limits the thermal conductivity that can be achieved. To help overcome this issue, low molecular species, such as non-reactive solvent, plasticizer or other liquid viscosity reducing diluents are added to the formulation. However, a downside to this approach, as seen in epoxy based formulations, is these low molecular weight species cause shrinkage issues, void formation, and delamination when the adhesive is cured.

Other approaches for obtaining high bulk thermal conductivities have employed fillers that are known to sinter as temperatures amenable to electrical devices processing temperatures. For example, U.S. Pat. No. 7,083,850 entitled "Electrically Conductive Thermal Interface" describes a porous, flexible, resilient heat transfer material which comprises a network of metal flakes. The material is made by forming a conductive paste comprising a volatile organic solvent and conductive metal flakes. The conductive paste is heated to a temperature below the melting point of the metal flakes, thereby evaporating the solvent and sintering the flakes only at their edges. While highly thermally conductive, this material is quite limited in its ability to adhere to surfaces and has an intrinsically high modulus owing to pure filler remaining once the solvent is removed. Moreover, most packaging processes prefer low solver to solvent-less materials owing to the complexities and environment concerns with removing solvent.

It would thus be desirable to sinter metal flakes within interface material obtaining adhesive. Unfortunately, sintering in not achieved at low to moderate fillers loadings. This limitation is associated with the lack of direct filler particle contacts required for filler to occur due to the matrix material that coats them. It is only at very high volume percent filler that some sintering occurs, but at such concentrations the unreacted adhesive composition becomes extremely viscous and even solid-like and lacks the desirable polymeric attributes such as good adhesion, toughness, etc. It is this reason that existing approaches have resorted to using considerable amounts of solvents to address the viscosity issue which again has its downsides as mentioned earlier.

To this end, it would be desirable to provide a solvent-free (or low solvent) adhesive composition comprising a matrix polymer and low to moderate levels of filler material which exhibits high conductivity resulting from sintered filler, and also provides adhesive properties while maintaining beneficial properties such as dispensability, proper coefficient of thermal expansion, improved toughness, shock and vibration resistance, environmental protection, and the like.

It is further desirable to provide a homogeneous material in the unreacted state comprising filler particles in a reactive organic matrix whose properties and cure condition could be controlled to generate a heterogeneous structure during curing and whose final properties exhibit high levels of thermal and/or electrical conductivity among other attributes.

SUMMARY OF THE INVENTION

This invention describes a method for selecting materials and processing conditions to prepare a heterogeneous structure in situ via the reaction of a homogeneous mixture of a reactive organic compound and a filler, which may then optionally be sintered. In a preferred embodiment of the present invention, the method is employed to provide a heterogeneous composite possessing exceptionally high thermal and/or electrically conductivities for a given concentration of conductive filler. The choice of materials as well as processing conditions employed, as will be described below, have a strong effect on the rate domain formation/heterogeneity of the structure formed, the extent of filler particle-particle interactions within filler-rich domains, and ultimately the thermal and/or electrical conductivity. Proper choice of these conditions can lead to composites having enhanced properties at a reduced bulk filler concentration.

One aspect of the present invention is lower electrical percolation threshold concentrations and enhanced conductivities beyond percolation can be achieved through the formation of a heterogeneous composite from the reaction of a homogeneous mixture of filler and organic compound. Through appropriate selection and reaction of the organic compound, a heterogeneous structure can be formed comprising filler rich domains that are greater in concentration that of the bulk filler concentration. Such a structure, as will be shown, ultimately allows for electrically percolation to occur at significantly lower concentrations of filler than what is required in final composites that comprise a homogeneous dispersion of filler. Moreover, the structure when formed from sinterable or metal fillers and cured under the appropriate conditions is capable of forming a fused network of filler thereby further improving electrical conductivity at levels.

In a first aspect of the present invention, a method for producing a composite is provided comprising a) selecting a reactive organic compound, b) selecting an inorganic filler component, c) mixing the reactive organic compound and the inorganic filler component, wherein at room temperature the organic compound and the filler component mix to form a substantially homogeneous structure having a bulk filler concentration, and d) reacting the organic compound to form a polymer, wherein the polymer has a repulsive interaction with the inorganic filler thereby creating, in situ, a heterogeneous structure comprising filler rich domains.

In one embodiment of the present invention, the concentration of the filler is higher than that of a bulk filler concentration. In a further embodiment of the present invention, the reactive organic compound comprises at least one of monomers, oligomers, prepolymers, or reactive polymers. In a further embodiment of the present invention, the organic compound further comprises a cure agent. In another embodiment of the present invention, the reaction of step d) is advanced by heating the mixture. In an alternate embodiment of the present invention, the reaction of step d) is advanced by exposing the mixture to activating ultraviolet radiation.

In yet another embodiment of the present invention, the composition further comprises a second filler component. In an additional embodiment of the present invention, the second filler component resides substantially with the polymer after the organic compound has been reacted.

In a further embodiment of the present invention, the inorganic filler component comprises an inorganic filler coated with an organic coating. In another embodiment of the present invention, the organic coating on the filler has an affinity for the reactive organic compound. In a preferred embodiment of the present invention, the coating on the filler comprises stearic acid. In another embodiment of the present invention, the coating on the filler is present in a single layer as averaged over substantially all of the filler. In yet another embodiment of the present invention, the coating on the filler has a repulsive interaction with the new polymer formed from the step of reacting the organic component. In a preferred embodiment of the present invention, the coating on the filler comprises a non-polar coating and the polymer formed during step d) comprises polar moieties.

In another embodiment of the present invention, the filler is thermally conductive and/or electrically conductive. In an additional embodiment of the present invention, the filler comprises solder. In a further embodiment of the present invention, the filler comprises less than 75 percent by weight based on the total weight of the composition. In a still further embodiment of the present invention, the filler comprises less than 50 percent by volume based on the total volume of the composition. In one embodiment of the present invention, the filler comprises at metallic filler of at least one of nickel, copper, silver, palladium, platinum, gold, and alloys thereof. In a further embodiment of the present invention, the filler comprises a cold worked silver flake.

In a further aspect of the present invention, the filler comprises a sinterable filler. In one embodiment of the present invention, the method further comprises the step of sintering the filler particles together. In another embodiment of the present invention, the step of sintering the filler particles together and the step of reacting the organic compound are performed simultaneously. In still another embodiment of the present invention, substantially all of the sinterable filler particles that are in direct contact with one another are sintered. In one embodiment of the present invention, the step of sintering is performed at a temperature above approximately 100° C. In another embodiment of the present invention, the step of sintering is performed at a temperature of above approximately 150° C. In a still further embodiment of the present invention, the sintering step is enhanced by an applied pressure on the composition. In another embodiment of the present invention, the degree of sintering is regulated through selection of sintering temperature and pressure. In a still further embodiment of the present invention, the mixture of the reactive organic component and the filler is a solvent-free 100% solids composition.

In a further aspect of the present invention, a composite material is provided comprising, an organic compound, and, an inorganic filler, wherein the organic compound and inorganic filler comprise a heterogeneous structure comprising filler-rich domains wherein the filler concentration is higher than the bulk filler concentration, and said filler rich domains were formed in situ from a homogeneous mixture of the organic compound and the inorganic filler.

In a still further aspect of the present invention, a method for increasing the conductivity of a conductive composition is provided comprising, selecting an inorganic filler which is at least one of thermally conductive and electrically conductive, selecting an organic material, selecting a desired filler amount, mixing the conductive filler and organic material, wherein the homogeneous mixture of filler and matrix material comprises a bulk conductivity, and selecting cure conditions to create a heterogeneous structure so as to provide a cured composition comprising a conductivity that is higher than the bulk conductivity of the mixture having a homogeneous structure.

In an additional aspect of the present invention, a thermally conductive adhesive is provided comprising, a filler coated with a non-polar coating, an organic component comprising polar functionality, and wherein the thermal conductivity of the cured adhesive is greater than 15 W/mK and the silver flake concentration is less than 50% by volume. Unlike other methods for producing filled polymeric systems, the methods of embodiments of the present invention provide higher thermal and/or electrical conductivity at significantly lower filler contents. This typically leads to lower viscosities, better toughness, better adhesion, and other enhanced physical properties all while achieving higher conductivities that bulk filler loading would allow.

Additionally, the lower concentration of filler permits less adsorbed moisture and air in the formulation brought in by the filler allows for better wetting of a substrate, and enables for application methods such as screen printing due to the newly achieved low-viscosity 100% solids system, which provides the same or better conductivity as prior art systems.

As will be realized by those of skill in the art, many different embodiments of the methods for producing a heterogeneous composite from the reaction of homogeneous organic compound-filler mixture according to the present invention are possible. Additional uses, objects, advantages, and novel features of the invention are set forth in the detailed description that follows and will become more apparent to those skilled in the art upon examination of the following or by practice of the invention.

Thus, there has been outlined, rather broadly, the more important features of the invention in order that the detailed description that follows may be better understood and in order that the present contribution to the art may be better appreciated. There are, obviously, additional features of the invention that will be described hereinafter and which will form the subject matter of the claims appended hereto. In this respect, before explaining several embodiments of the invention in detail, it is to be understood that the invention is not limited in its application to the details and construction and to the arrangement of the components set forth in the following description or illustrated in the drawings. The invention is capable of other embodiments and of being practiced and carried out in various ways.

It is also to be understood that the phraseology and terminology herein are for the purposes of description and should not be regarded as limiting in any respect. Those skilled in the art will appreciate the concepts upon which this disclosure is based and that it may readily be utilized as the basis for designating other structures, methods and systems for carrying out the several purposes of this development. It is important that the claims be regarded as including such equivalent constructions insofar as they do not depart from the spirit and scope of the present invention.

So that the manner in which the above-recited features, advantages and objects of the invention, as well as others which will become more apparent, are obtained and can be understood in detail, a more particular description of the invention briefly summarized above may be had by reference to the embodiment thereof which is illustrated in the appended drawings, which drawings form a part of the specification and wherein like characters of reference designate like parts throughout the several views. It is to be noted, however, that the appended drawings illustrate only preferred and alternative embodiments of the invention and are, therefore, not to be considered limiting of its scope, as the invention may admit to additional equally effective embodiments.

DETAILED DESCRIPTION OF THE PREFERRED EMBODIMENTS

Figure 1:
FIG. 1 A scanning electron micrograph (SEM) photomicrograph of a heterogeneous composite according to an embodiment of the present invention. Note the sample because of its high electrical conductivity required no gold sputter coating prior to SEM imaging.

In a first embodiment of the present invention a method is presented for producing a heterogeneous structure in situ via the reaction of a homogeneous mixture of a filler and reactive organic compound. The mechanism of structure formation is achieved through the proper selection of component materials and adherence to particular processing conditions. In one embodiment of the present invention, the filler component comprises a conductive filler (thermal, electrical or both) and the organic compound comprises a monomer and optionally a curative agent. The formation of filler rich domains during reaction of the organic material allows for direct filler-to-filler particle contacts to be made. In the presence of heat the particles may further sinter together. Sintering eliminates the contact resistance between the previously non-sintered filler particles thereby substantially improving the thermal and/or electrically conductivity of the composite.

While not fully understood and not wishing to be bound by this theory, it is believed that domain formation and sintering in the composition are sensitive to the organic material's cure temperature, the cure time, and the level of pressure applied during the cure. In other words, domain formation and sintering are kinetically driven processes. In a still a further embodiment, the rate at which the sample is heated will affect the extent of domain formation and sintering. The effects of cure time, temperature, and pressure are outlined in the exemplary embodiments discussed herein. In total, the processing conditions can be tailored to achieve a conductive adhesive having the best combination of properties at minimal filler loading, which often translates to lower cost and opportunity to take advantage other properties that are adversely affected by high filler loadings. In some cases, when the adhesive is employed in an application that is not able to withstand high sintering temperatures, higher pressures or non-traditional sintering techniques may used to achieve exceptionally high conductivities.

The filler component and reactive organic compounds are chosen so as to create a homogeneous mixture when mixed. However, during the cure, it is believed that the resulting polymer formed from the organic compound then has a repulsive interaction with the filler so as to form a heterogeneous compound having filler-rich domains wherein the filler composition is significantly higher than the bulk filler concentration. Thus, while the overall (bulk) filler concentration of the compound does not change, the filler particles and the organic component separate in situ into respective regions of high concentration. This phenomenon can lead to a network of interconnected filler particles formed in situ from a mixture having very few, if any, initial filler-filler contacts.

There are several approaches which may be employed to create the repulsive interaction between the filler component and the organic compound. However, in a preferred embodiment of the present invention, this is achieved by coating a metallic filler particle with a non-polar coating and mixing the coated filler in a reactive organic compound comprising a relatively non-polar resin and a polar curing agent. In an uncured state, the resin, curative, and filler form a relatively homogeneous mixture in which the coated filler and the resin are compatible with one another and form a relatively homogeneous mixture. However, with the application of heat the curing agent reacts with the resin forming a polymer having polar moieties thereon, resulting in a repulsive interaction between the non-polar coating on the filler and the polar moieties on the polymer. This leads to the gross separation of the two materials to create polymer-rich and filler-rich domains whose respective concentrations are significantly higher than the bulk concentrations of polymer and filler, respectively. Moreover, extensive domain formation is capable of creating continuous filler-rich domains with substantial particle to particle contact between most of the filler particles.

Other types of interactions capable of creating repulsive effects upon curing of the organic compound in the presence of the filler, could consist of, but are not limited to, electrostatic interactions, hydrogen bonding interaction, dipole-dipole interactions, induced dipole interaction, hydrophobic-hydrophilic interactions, van der Waals interactions, and metallic interactions (as with an organometalic compound and metallic filler). Other forms of repulsive interactions could arise from entropic related effects such as molecular weight differences in the polymers formed from the organic compound(s). Additionally, repulsive interactions could arise as a result of an external stimulus such as electrical field.

The domains formed upon curing of the organic compound in the presence of the filler results in filler-rich domains having a higher than bulk (average) filler concentrations and in organic rich domains having lower than bulk (average) filler concentrations. The areas of higher than average filler concentration can form semi-continuous or continuous pathways of conductive filler material extending throughout the body of the cured composition. These pathways provide a low resistance route through which electrons and/or thermal phonons can travel. In other words, the pathways or channels allow for greatly enhanced thermal or electrical conductivity. This conductive pathway may be further enhanced by sintering the filler particles together.

Sintering, as it is understood in the art, is a surface melting phenomenon in which particles are fused together at temperatures below the material's bulk melting temperature. This behavior is brought about by a tendency of the material to relax into a lower energy state. As such, selection of filler type, size, and shape can greatly affect the sinterability of the filler particles. Certain particles, such as thin, wide, flat, plates are often formed by shearing large particles via various milling processes. This process imparts a large amount of internal stress in addition to creating a large amount of surface area. When a certain amount of heat is added to the particles, they will have the tendency melt and fuse together thereby relieving the internal strain and decreasing the overall surface energy of the particles. For this reason, the preferred filler particles for use in the present invention are those that comprise some degree of thermal or electrical conductivity and sinter easily. In a still further embodiment of the present invention, the preferred filler comprises a metallic particle that has been subjected to cold working which has imparted strain into the structure of the filler.

The sintering temperature will vary according to the material chosen as the filler, as well as the geometry of the filler particle. However, in a preferred embodiment of the present invention, it is advantageous to balance the cure of the organic compound and the sintering of the filler such that they occur simultaneously. In this embodiment, the cure temperature and profile is selected to coincide with the sintering temperature of the filler, so as the organic compound becomes repulsive to the filler and the filler particles are forced together, the individual filler particles can sinter once particle to particle contact is made. This is believed to be responsible for the continuous filler structure seen throughout the fully cured composition. In a preferred embodiment of the present invention, the cure temperature is at least about 100° C., more preferably about 150° C., and even more preferably above 150° C. for a silver flake filler.

In a preferred embodiment of the present invention, the compositions are cured and optionally sintered via application of heat to the composition. This is commonly accomplished in a cure oven whereby hot air or radiated heat is used to increase the temperature of the composition. In alternate embodiments of the present invention, other methods of cure may be employed such as induction curing in an electromagnetic field, microwave curing, infrared curing, electron beam curing, and ultraviolet curing. Additionally, the cure reaction may be self accelerated through the use of an exothermic cure reaction. A non-thermal cure may be desirable, for example, when the composition is coated on a temperature sensitive substrate such as a plastic.

In one embodiment of the present invention the filler comprises inorganic fillers. Available fillers include pure metals such as aluminum, iron, cobalt, nickel, copper, zinc, palladium, silver, cadmium, indium, tin, antimony, platinum, gold, titanium, lead, and tungsten, metal oxides and ceramics such as aluminum oxide, aluminum nitride, silicon nitride, boron nitride, silicon carbide, zinc oxide. Carbon containing fillers could consist of graphite, carbon black, carbon nanotubes, and carbon fibers. Suitable fillers additionally comprise alloys and combinations of the aforementioned fillers. Additional fillers include inorganic oxide powders such as fused silica powder, alumina and titanium oxides, and nitrates of aluminum, titanium, silicon, and tungsten. The particulate materials include versions having particle dimensions in the range of a few nanometers to tens of microns. In a preferred embodiment of the present invention, the filler comprises a material that is either thermally conductive, electrically conductive or both. Although metals and metal alloys are preferred for use in several embodiments of the present invention, the filler may comprise a conductive sinterable non-metallic material.

In an embodiment of the present invention, the filler component must be able to interact with the organic compound to impart a heterogeneous structure in the finished material. In a preferred embodiment of the present invention as discussed above, this is accomplished through the interaction of a polar organic compound with a non-polar filler. For preferred filler materials, such as metals, the filler is coated with a material comprising the desired degree of polarity. In one preferred embodiment of the present invention, the filler coating comprises a non-polar fatty acid coating, such as stearic acid. In a still further embodiment of the present invention, the filler coating comprises another non-polar material, such as an alkane, paraffin, saturated or unsaturated fatty acid, alkene, fatty esters, or waxy coating. In additional embodiments of the present invention, non-polar coatings comprise ogranotitanates with hydrophobic tails or silicon based coatings such as silanes containing hydrophobic tails or functional silicones.

In an alternate embodiment of the present invention, the polarity of the filler/coating and polymer are reversed wherein the filler/coating comprises a polar moiety and the organic compound comprises a non-polar polymer. Similarly, in an embodiment of the present invention, in which a repulsive effect other than polarity is employed to drive the in situ domain formation, the active properties of the filler and organic components may be interchanged.

In a preferred embodiment of the present invention the organic compound comprises an epoxy resin and a cure agent. In this embodiment, the organic compound comprises from about 60 to about 100 volume percent of the total composition. In this embodiment, the organic compound comprises approximately from 70 to 80 percent by weight of a diglycidal ether of a bisphenol compound, such as bisphenol F, and 20 to 30 percent by weight of a cure agent, such as a polyamine anhydride adduct.

In additional embodiments of the present invention, suitable organic compounds comprise polysiloxanes, phenolics, novolac resins, polyacrylates, polyurethanes, polyimides, polyesters, maleimide resins, cyanate esters, polyimides, polyureas, cyanoacrylates, and combinations thereof. The cure chemistry would be dependant on the polymer or resin utilized in the organic compound. For example, a siloxane matrix can comprise an addition reaction curable matrix, a condensation reaction curable matrix, a peroxide reaction curable matrix, or a combination thereof. Selection of the cure agent is dependant upon the selection of filler component and processing conditions as outlined herein to provide a heterogeneous structure formed in situ.

Example 1

Silver flake coated with stearic acid was first added to a reactive organic resin, namely diglycidal ether of bisphenol F (DGEBF), in a 100 gram Hauschild® mixing cup and thoroughly mixed for a minimum of two cycles at 2200 rpm for 1 minute/cycle. A second reactive organic compound, i.e. a curing agent, was then added and mixed for a minimum of two cycles at 2200 rpm for 1 minute/cycle. The resulting material was cast between 19 mm thick, Teflon coated aluminum plates separated with 1 mm glass slides. Samples were cured with a convection oven using a programmed ramp which consisted of heating the sample from room temperature to 160° C. over the course of 40 minutes followed by an isothermal hold for 1 hour.

Bulk thermal conductivity was measured via the Flash Method (ASTM E1461). Test specimens were cut from the cured samples. Samples were 12.7 mm in diameter and ~1 mm in thickness. All samples were spray-coated with a thin film of graphite to ensure complete absorption of the incident radiation.

Volume electrical conductivity was measured as follows: Uncured samples were made into strips ~1 mm in thickness, ~40 mm in length, and ~2 mm in width. Copper wire was placed at the ends of the uncured composite prior to curing. The ends of the wire were lightly sanded prior to insertion. The samples were cured using the same heating profile described above. The electrical resistance (or conductance) was measured using a Keithley 580 Micro-ohmmeter. The volume conductivity was calculated from the sample dimensions and the measured resistance.

The morphology of the cured composites was analyzed via Scanning Electron Microscopy (SEM) using a FEI XL30 SEM set at an operating voltage of 10 kV and a spot size of 3. Highly electrically conductive samples required no gold sputter coating, i.e. Example 1, whereas poorly conductive samples did, i.e. Control 1-A and 1-B. Gold was applied under an Argon atmosphere, a pressure of ~50-75 mTorr, and deposition time of 20-30 s using a Denton Desk II sputter coater.

Table 1 lists three different composites ultimately differing in structure and corresponding conductivity. Choice of curative in combination with the other constituents (epoxy resin, filler and filler coating) and curing conditions will dictate the structure formed during curing and the resulting properties of the composite. Example 1 in Table 1 and the corresponding SEM photomicrograph shown in FIG. 1 illustrate that by using a polyamine anhydride adduct (PAA) to cure DGEBF in the presence of stearic acid coated silver flake, a heterogeneous composite can be formed during cure and thereby result in exceptional thermal and electrical conductivity.

In the uncured state, Example 1 consists of homogeneous mixture of DGEBF, PAA, and stearic acid coated silver. During cure, it is believed that the resin and curative react to form a polymer that has a repulsive interaction between the newly-formed polymer and the stearic acid coated silver flake. The extent of repulsion is large enough that the polymer molecules would prefer to reside with other polymer molecules rather than with the stearic acid coated filler. Thus, the polymer diffuses to isolated domains thereby creating a highly heterogeneous structure of polymer-rich and silver-rich domains.

FIG. 1 is an SEM photomicrograph of the heterogeneous morphology consisting of discrete polymer-rich domains (very light, globular regions typically 5-20 microns in size) distributed throughout a continuous silver-rich phase. (Note that the Example 1 sample in FIG. 1 was not coated with gold prior to SEM imaging. Thus regions that are electrically insulating will be heavily charged under the microscope and appear very bright and amorphous, i.e. polymer rich domains. Regions that are highly conductive will help dissipate the incident electron beam and appear less charged and have finer detail, i.e. silver rich domain.) The silver rich regions comprise silver flake particles with define edges and shapes, unlike the polymer rich areas.

Figure 2:
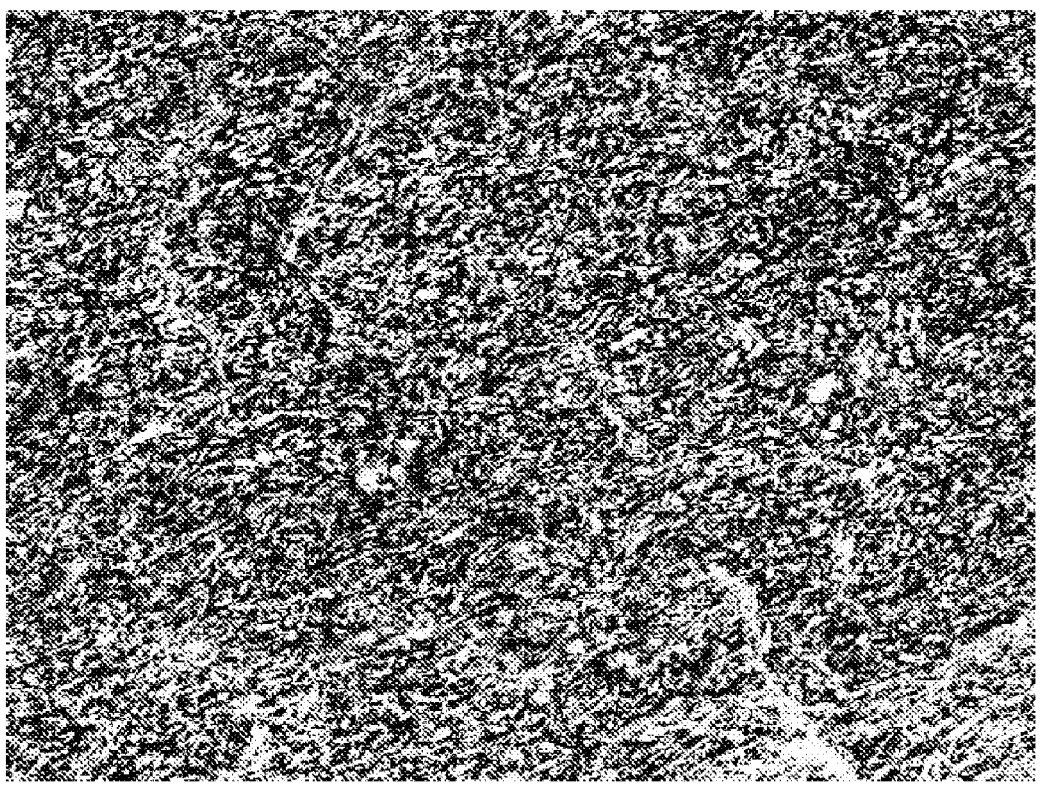
FIG. 2 A SEM photomicrograph of a homogeneous composite according to conventional technologies. Note the sample because of its limited electrical conductivity required gold sputter coating prior to SEM imaging.
Figure 3:
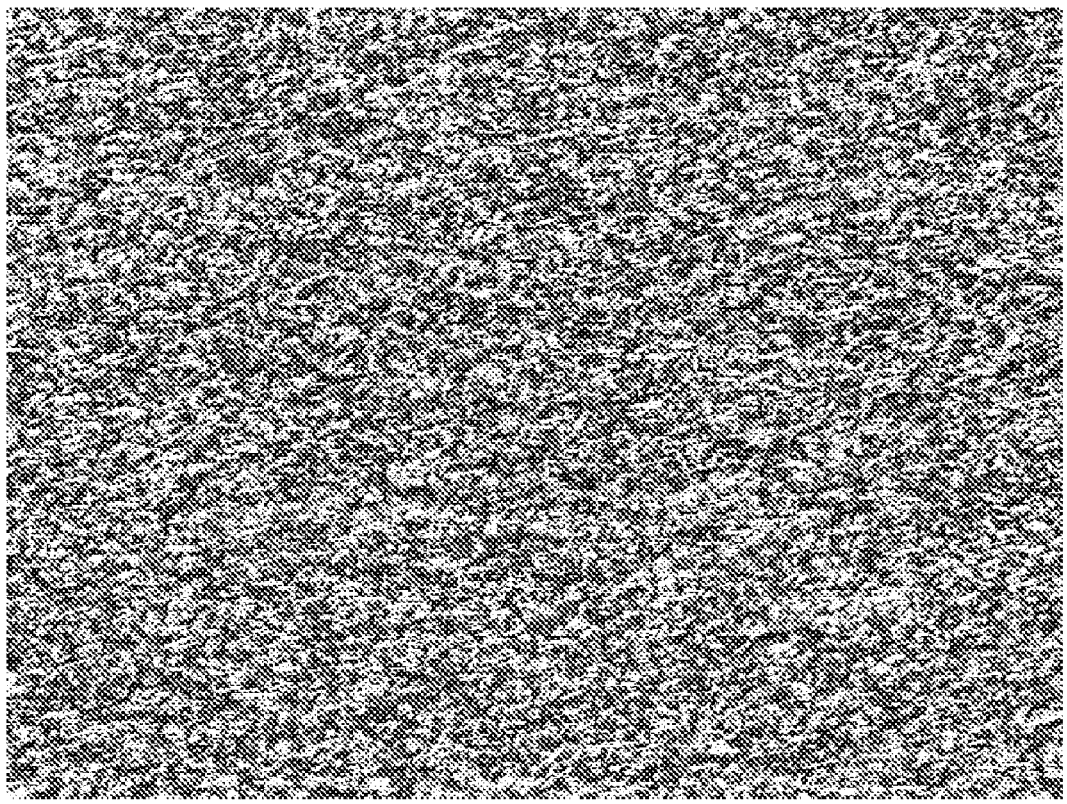
FIG. 3 A SEM photomicrograph of a homogeneous composite according to conventional technologies. Note the sample because of its limited electrical conductivity required gold sputter coating prior to SEM imaging.

In contrast to Example 1, Control 1-A and Control 1-B samples based on diethylentriamine (DETA) and an imidazole curative, respectively, and consist of a cured composite that has a homogeneous structure comprising an even distribution of silver throughout the sample as seen in FIGS. 2 and 3. (Note; FIGS. 1-3 were all taken at the same magnification.) In this type of homogeneous structure, the local concentration of silver is comparable to that of the bulk concentration, which is not the case in the heterogeneous composites (Example 1).

Ultimately, the differences in structure formed upon cure lead to dramatic differences in thermal and electrical properties. The heterogeneous structure of Example 1 results in approximately 22 times the thermal conductivity and ~3-4 orders of magnitude higher electrical conductivity than that of the homogeneous structure of Control 1-A and 1-B samples.

TABLE 1

Effect of composite structure on the morphology and properties of silver flake filled -diglycidal either of bisphenol F (DGEBF) composites.

| Ingredient by wt % (vol %) | Example 1 | Control 1-A | Control 1-B |
|---|---|---|---|
| DGEBF | 13.4 | 18.2 | 17.8 |
| PAA[a] | 4.6 | — | — |
| DETA[b] | — | 2.2 | — |
| Imidazole[c] | — | — | 0.7 |
| Silver flake[d] | 82.0 | 79.6 | 81.5 |
|  | (33 vol %) | (30 vol %) | (33 vol %) |
| Total | 100 | 100 | 100 |
| Cured Structure | Heterogeneous | Homogeneous | Homogeneous |
| Thermal Conductivity, k (W/m · K) | 22.3 | 0.92 | 1.2 |
| Electrical Volume Conductivity, (S/cm) | 3.8E+04 | 3.2E+00 | 4.6E+01 |

[a]Epoxy curative - PAA - polyamine anhydride adduct formed from the reaction of diethylene triamine (DETA) and pthalic anhydride
[b]Epoxy curative - DETA - diethylene triamine
[c]Epoxy curative - 1-(2-cyanoethyl)-2-ethyl-4-methylimidazole
[d]Stearic acid coated silver flake (surface area = 0.83 m$^2$/g, weight loss in air at 538° C. = 0.35%)

Example 2

Figure 4:
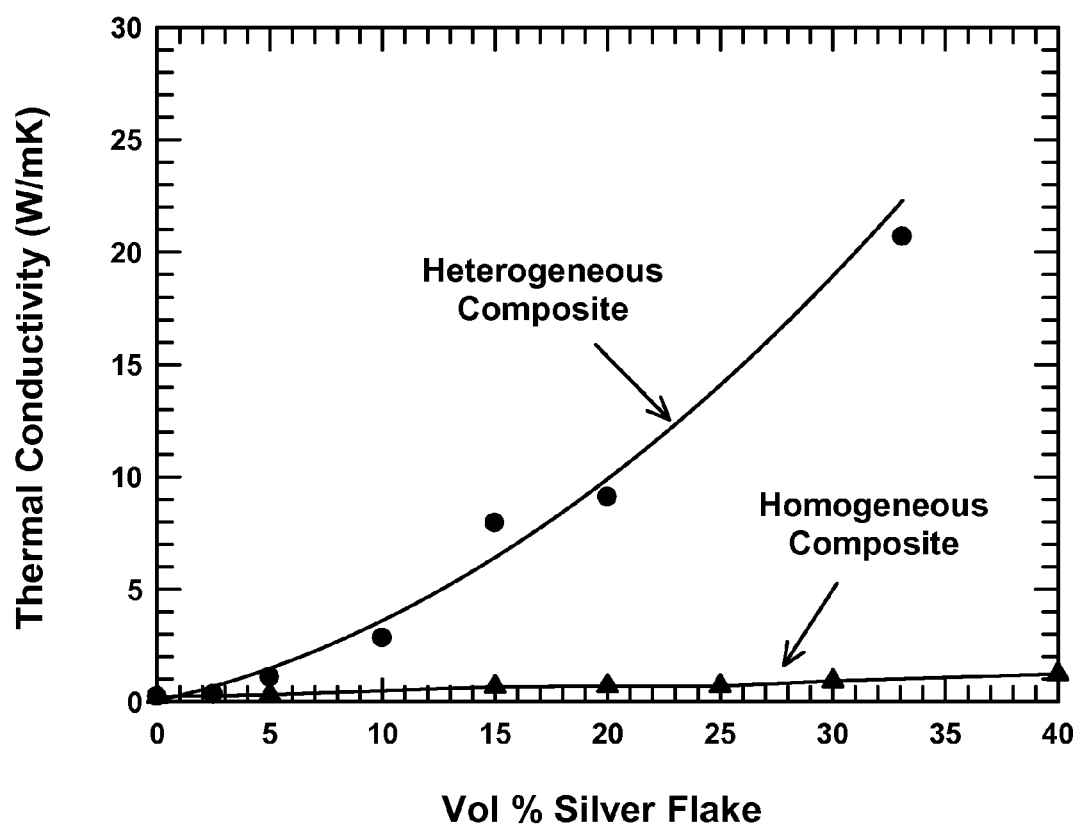
FIG. 4 A graph illustrating the effect of silver flake concentration on the thermal conductivity of composites based on homogeneous structure versus heterogeneous structure (derived in situ).
Figure 5:
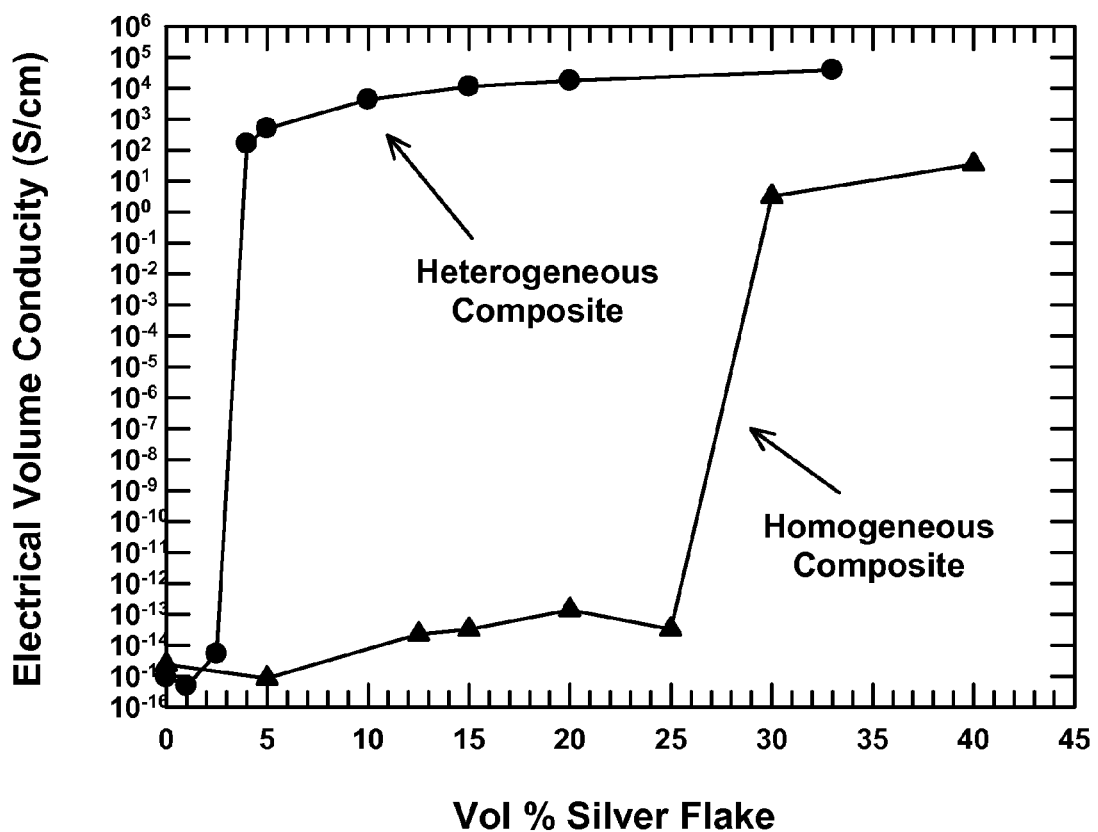
FIG. 5 A graph illustrating the effect of silver flake concentration on the electrical volume conductivity of composites based on homogeneous structure versus heterogeneous structure (derived in situ).
Figure 6:
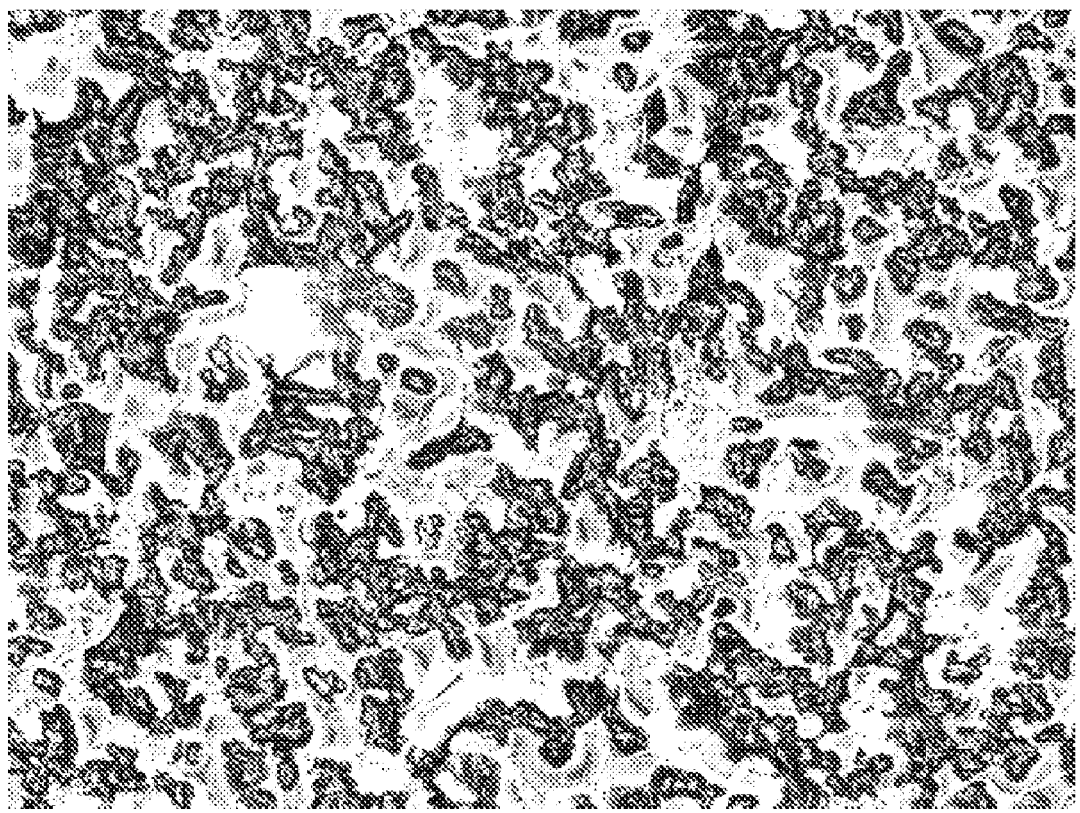
FIG. 6 A SEM photomicrograph of a heterogeneous composite in an embodiment of the present invention containing 5 volume percent silver flake. Note: this image was taken at one half the magnification of FIGS. 1-3.

The samples corresponding to data shown in Table 2 and FIGS. 4-6 were prepared according the description provided in Example 1 with the exceptions of select electrical volume conductivity measurements. The resistance (or conductance) of each sample dictated the choice of resistivity instrumentation. Samples having resistances in excess of ~$10^{10}$ ohms were measured via ASTM D-257 using a HP 4339B High Resistance Meter equipped with a 16008B resistance cell. Samples were in the form of circular disks ~1 mm in thickness and >60 mm in diameter. Samples having resistances in the range of ~$10^2$-$10^{10}$ ohms were measured using a Keithley 610C Electrometer. Samples in this case were in the form of well-defined strips. Uncured samples were cured into strips 1 mm in thickness, ~40 mm in length, and ~2 mm in width. Copper wire was placed at the ends of the sample prior to curing. The ends of the wire were lightly sanded prior to insertion. The samples were cured using the same heating profile described in Example 1. The volume conductivity was calculated from the sample dimensions and the measured resistance. Samples having electrical resistances below ~$10^2$ ohms were measured according the procedure described in Example 1.

Table 2 and FIGS. 4 & 5 show the effect of stearic acid coated silver flake concentration on the thermal and electrical conductivity of cured composites possessing a heterogeneous structure versus a homogeneous structure (structures previously described in Example 1). The heterogeneous structure in this example was formed from the reaction two organic components, namely DGEBF (resin) and PAA (curative) in the presence of the stearic acid coated silver flake. As seen in FIG. 4, the thermal conductivity of the heterogeneous structure dramatically increases with silver flake concentration. At about 33 volume percent silver flake the thermal conductivity of the heterogeneous composite is roughly 100 times that of the unfilled polymer.

In contrast, when the DETA curative is used a homogeneous structure is formed and the thermal conductivity follows a much more shallow response with respect to filler loading. At about 33 volume percent silver flake the thermal conductivity of the homogeneous material is only roughly 4 times that of the unfilled polymer.

Comparing the two systems at a fixed thermal conductivity of 1 W/mK, the heterogeneous composite requires only about 5 volume percent silver flake whereas the homogeneous composite requires 7 times the concentration of silver, i.e. about 35 volume percent to achieve the same thermal conductivity. As will be discussed in Example 3, the exceptional thermal conductivity observed in the heterogeneous composite is a result of the segregation of the polymerized material from the silver particles which enables direct particle-particle contacts and subsequent particle sintering.

In the case of electrical conductivity, the heterogeneous structure enables electrical percolation, i.e. the point at which the material abruptly changes from electrically insulating to conducting, to be achieved at a fraction of the silver concentration needed to do the same in the homogeneous system. This observation is evident in the data shown in Table 2 and FIG. 5. The percolation threshold is about 3 volume percent stearic acid coated silver flake in the heterogeneous composite (based on DGEBF and PAA) versus roughly 27 volume percent stearic acid coated silver flake in the homogeneous composite (based on DGEBF and DETA). This much lower threshold is a result of creation of continuous, concentrated domains of silver upon curing. FIG. 6 shows such morphological features observed at 5 volume percent Ag Flake, i.e. just beyond the electrical percolation threshold.

In addition to electrical percolation, the ultimate electrical conductivity is considerably higher at silver concentrations beyond the percolation threshold. For example, the concentration of coated silver flake needed to achieve a volume conductivity of about 100 S/cm is roughly 4 volume percent for the heterogeneous composite whereas over 40 volume percent silver flake is required for the homogeneous system. As will be discussed in Example 3, the exceptional thermal conductivity observed in the heterogeneous composite is a result of the segregation of the polymerized material from the silver particles which enables direct particle-particle contacts and subsequent particle sintering.

TABLE 2

The effect of composite morphology on the thermal and electrical conductivity as function of silver flake concentration.

| Vol % Silver Flake | Thermal Conductivity, k (W/m · K) | Electrical Volume Conductivity, (S/cm) |
|---|---|---|
| DETA Cured[a] | | |
| 0 | 0.22 | 2.4E−15 |
| 5 | 0.31 | 8.4E−16 |
| 15 | 0.67 | 3.2E−14 |

TABLE 2-continued

The effect of composite morphology on the thermal and electrical conductivity as function of silver flake concentration.

| Vol % Silver Flake | Thermal Conductivity, k (W/m · K) | Electrical Volume Conductivity, (S/cm) |
|---|---|---|
| 20 | 0.69 | 1.4E−13 |
| 25 | 0.69 | 3.3E−14 |
| 30 | 0.92 | 3.2E+00 |
| 40 | 1.23 | 3.5E+01 |
| PAA Cured[b] | | |
| 0.0 | 0.23 | 9.1E−16 |
| 1.0 | 0.21 | 4.8E−16 |
| 2.5 | 0.32 | 5.2E−15 |
| 4.0 | 0.44 | 1.6E+02 |
| 5 | 1.07 | 5.0E+02 |
| 10 | 2.82 | 4.3E+03 |
| 15 | 7.94 | 1.1E+04 |
| 20 | 9.10 | 1.7E+04 |
| 33.1 | 22.3 | 3.8E+04 |

[a]DETA - diethylene triamine used to cure DEGBF resin.
[b]PAA - polyamine anhydride adduct used to cure DEGBF resin.

Example 3

DGEBF (resin), PAA (curative), and stearic acid coated silver flake (filler) were mixed (uncured state) and characterized (cured state) as outlined in Example 1. The samples were cured by placing them in a preheated convection oven and curing them for 2 hours. Studies on as-received flake involved first pressing the powder in to 1-3 mm thick, 12.5 mm diameter pellet using a KBr hand press, set at a compressive force of approximately 0.5 Mg. The pellets were heat treated under the same conditions at which the composites were cured in the previous example.

Figure 7:
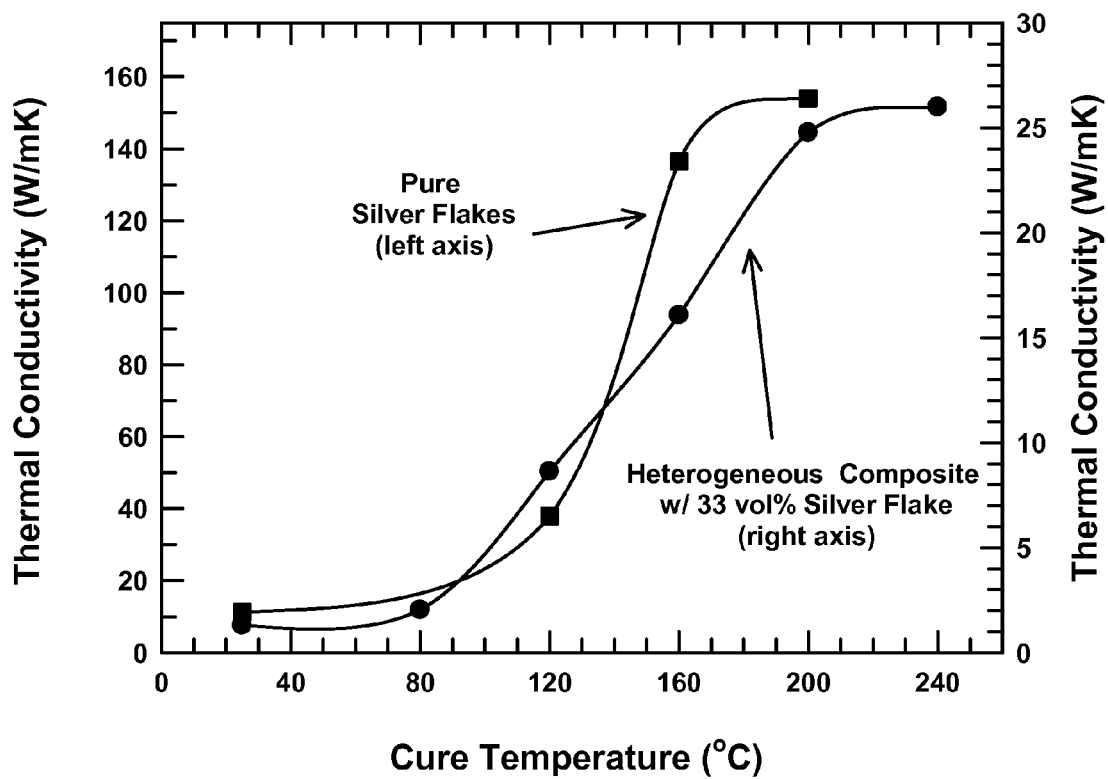
FIG. 7 A graph illustrating the effect of cure temperature on the thermal conductivity of pure silver flake (squares—left axis) and heterogeneous composites according to an embodiment of the present invention (circles—right axis).

Table 3 and FIG. 7 show how temperature dramatically affects the thermal conductivity of both the pure Ag flake and composites thereof. For both materials, the higher cure temperatures result in higher conductivities. Interestingly, both sets of data possess the same sigmoidal shape (see FIG. 7) with a small increase in conductivity observed below 120° C., followed by a steep temperature increase in the vicinity of 160° C., and then a plateau effect at about 200° C. and above. Similar to the composite, a 14 fold increase in conductivity is observed between the silver flake at room temperature versus the flake heat treated at 200° C. The dramatic increase both sets of samples is a result of sintering of the silver flake. Sintering of the particles eliminates the contact resistance between particles by creating a continuous pathway through which thermal phonons (and electrons) can travel.

Figure 8A:
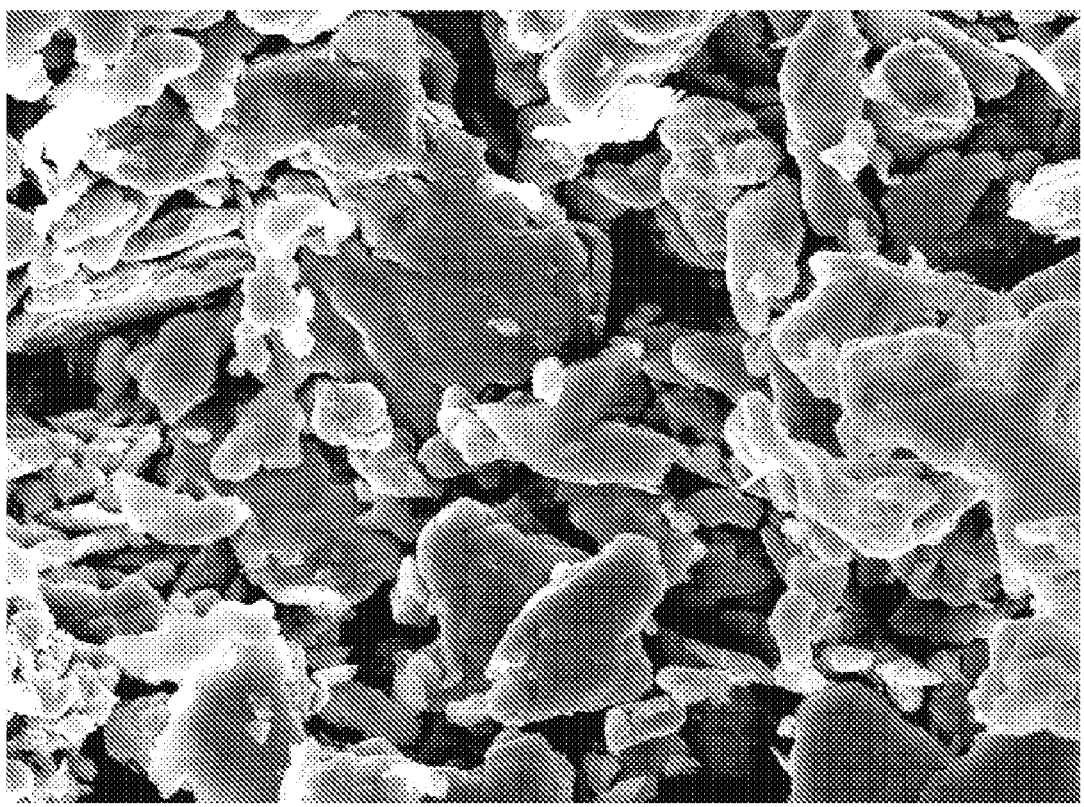
FIG. 8(a) A SEM photomicrograph of pure silver flake at 25° C.
Figure 8B:
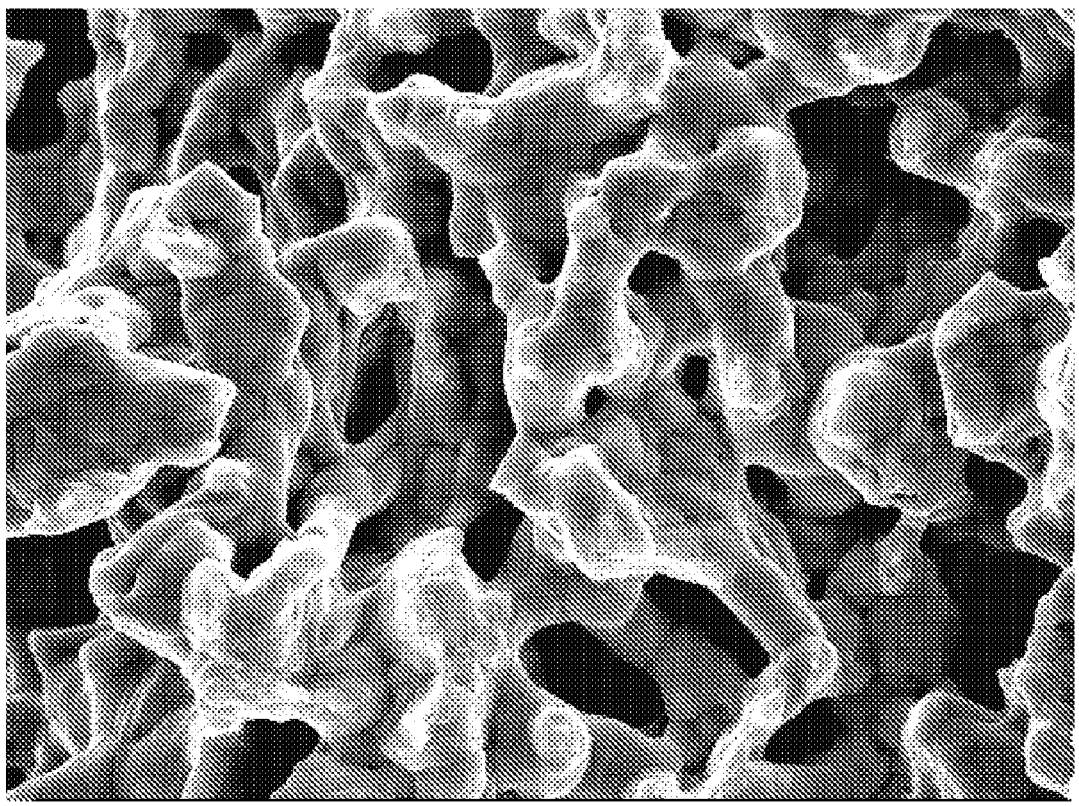
FIG. 8(b) A SEM photomicrograph of pure silver flake heated at 200° C.

FIG. 8 provides morphological evidence of the sintering of silver in the pure silver flake and heterogeneous composite based on the same flake. The unsintered silver flake as shown in FIG. 8(a) comprises plate-like particles with sharp, well-defined edges. Heat treating the flakes to moderate temperatures, i.e. 200° C. in the case of FIG. 8(b), causes the flakes to sinter, ultimately forming a stable interconnected structure. In the case of the heterogeneous composite based on coated silver flake, DGEBF, and PAA, sintering is enabled by the formation of the silver rich domains. Extensive silver domain formation during curing causes direct silver particle-to-particle contacts to occur. In the presence of sufficient heat, these contacting particles will sinter. This ultimately creates interconnected network of silver particles thereby minimizing the resistance to heat transfer.

Figure 9:
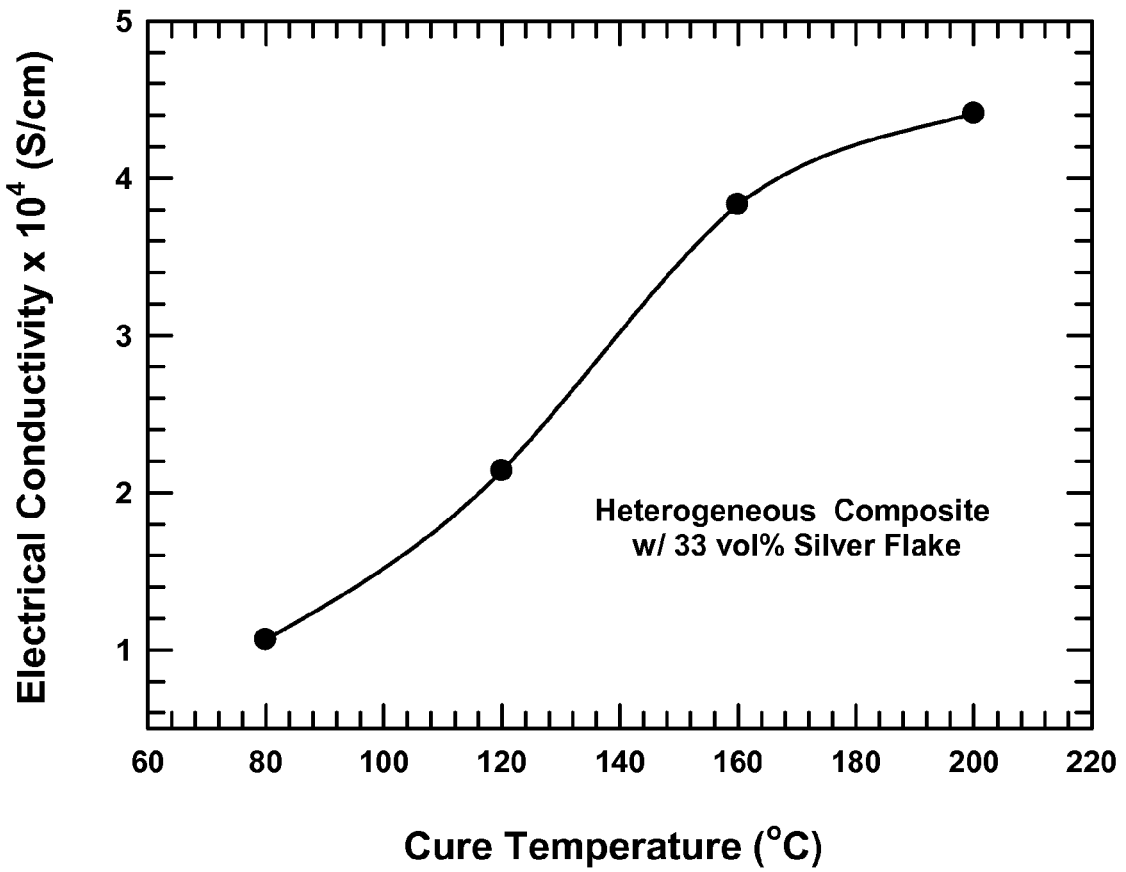
FIG. 9 A graph illustrating the effect of cure temperature on the volume electrical conductivity of heterogeneous composites containing 33 volume percent silver flake according to an embodiment of the present invention.

As with thermal conductivity, electrical conductivity of the heterogeneous composite increases with cure temperature. The data provided in Table 3 and displayed in FIG. 9 show approximately a four fold improvement in electrical conductivity when curing the 33 volume percent coated silver/DGEBF/PAA sample at 200° C. as compared to 80° C.

TABLE 3

Effect of cure temperature on the thermal and/or electrical conductivity of pure Ag flake and Ag flake filled DGEBF cured with PAA.

| Sample Cure Temperature (° C.) | Thermal Conductivity, k (W/m · K) | | Electrical Volume Conductivity, (S/cm) |
|---|---|---|---|
| | 100% Ag Flake | 33% Ag Flake Filled Composite | 33% Ag Flake Filled Composite |
| 25 | 11.3 | 1.3[a] | — |
| 80 | — | 2.0 | 1.1E+04 |
| 120 | 37.9 | 8.6 | 2.1E+04 |
| 160 | 136.5 | 16.1 | 3.8E+04 |
| 200 | 154.0 | 24.8 | 4.4E+04 |
| 240 | — | 26.0 | |

[a]Uncured sample.

Example 4

Steric acid coated silver flake was first added reactive organic resin, namely DGEBF, in a 100 gram Hauschild® mixing cup and thoroughly mixed for a minimum of two cycles at 2200 rpm for 1 minute/cycle. A second reactive organic component, i.e. a curing agent (PAA), was then added and mixed for a minimum of two cycles at 2200 rpm for 1 minute/cycle. The resulting material was cast between 19 mm thick, Teflon coated aluminum plates separated with 1 mm glass slides as spacers. Samples were cured in a two stage process: (1) samples were placed in convection oven and heated room temp to 120° C. (approximately 40° C./min ramp) and held at 120° C. with a total heating time=2 hours (2) post-cure samples were placed in a preheated compression mold set at 200° C. for 1 hr under various applied pressures. The resulting thermal conductivities of the samples were measured via the Flash Method.

TABLE 4

Effect of pressure on the thermal conductivity of in situ derived, heterogeneous composites.

| Applied Pressure (psi) | Thermal Conductivity, k (W/m · K) |
|---|---|
| 0 | 23.4 |
| 500 | 29.8 |

It is well known in the metallurgical literature, that the sintering of metal powders is facilitated by pressure. Thus, it was interest to determine how pressure affects the thermal conductivity of a heterogeneous composite comprised of sinterable fillers, like that of silver. Table 4 shows that indeed exposing the composites to temperature and pressure leads to higher conductivity.

Example 5

Samples in Tables 5 and 6 were mixed, cured, and characterized for thermal conductivity in an identical manner as described in Example 1.

Selection of base filler chemistry is another parameter influencing the ultimate conductivity observed in in situ derived heterogeneous composites. Table 5 shows the three examples of heterogeneous composites based on pure silver, silver coated copper, and aluminum flake. Each of the fillers possesses a similar stearic acid coating. Comparing the thermal conductivity of each Example on an equal volume percent filler basis to that of the homogeneous (conventional) composite containing silver flake gives an indication of the extent of sample heterogeneity and level of particle sintering.

Example 5-A exhibits over a three fold improvement in thermal conductivity relative to the homogeneous system at a filler concentration of 5 volume percent. Example 5-B, based on silver coated copper, has a thermal conductive that is over two times that of the homogeneous composites at filler loading 6 volume percent. Lastly, Example 5-C based on aluminum flake, exhibits a thermal conductivity about 79% higher than that of the homogeneous composite. The lower conductivity of this heterogeneous, aluminum filled composite relative to heterogeneous samples based on pure silver is a reflection of the aluminum's inability to sinter. Nevertheless, the aluminum-rich domains formed are still enough to significantly increase thermal conductivity.

TABLE 5

Effect of filler type on the thermal conductivity of heterogeneous composites

| Ingredient by wt % (vol %) | Control | Example 5-A | Example 5-B | Example 5-C |
|---|---|---|---|---|
| DGEBF | 8.27x | 50.2 | 49.1 | 51.1 |
| PAA | — | 17.1 | 16.7 | 17.4 |
| DETA | x | — | — | — |
| Silver Flake[a] | 100-x | 32.7 (5) | — | — |
| Silver coated copper flake[b] | — | — | 34.2 (6) | — |
| Aluminum flake[c] | — | — | — | 31.5 (16) |
| Total | 100 | 100 | 100 | 100 |
| Cured Structure | Homogeneous | Heterogeneous | Heterogeneous | Heterogeneous |
| Thermal Conductivity, k (W/m · K) | See FIG. 4/Table | 1.07 | 0.83 | 1.07 |
| Ratio of k to $k_{Control}$ at same vol % filler (See FIG. 4/ Table 2)[d] | 1.0 | 3.2 | 2.3 | 1.79 |

[a]Stearic acid coating.
[b]Silver amount = 20 wt %. Fatty acid coating is present on the outer silver layer.
[c]Fatty acid coating.
[d]Linear regression of the homogeneous data in Table 2 and FIG. 4 results in k = 0.0241 * (vol % Ag) + 0.211 with a goodness of fit $R^2$ = 0.96. This trend line provides a basis for comparison of thermal conductivity a homogeneous system (control) versus that of heterogeneous systems (Examples 5-A, B and C).

Example 6

Sample in Tables 6 and 7 were mixed, cured, and characterized in identical manner described in Example 1.

Table 6 shows the effect amount of filler coating on the thermal conductivity of composites based on DGEBF(resin), PAA(curative), and coated silver flake. The data is based on a common silver flake, yet the amount of stearic acid coating on the flake differs. As seen in Table 6, a low to medium coating level, i.e. less than a few monolayers result in exceptional thermal conductivity. However, an excessive coating amount leads to a substantial reduction in thermal conductivity.

The chemistry of the filler coating will also affect the level of heterogeneity formed during curing and the corresponding composite's properties. Table 6 shows the influence of two different silver coatings on the thermal conductivity of composites based on DGEBF, PAA, and silver flake. The data is based on the same base silver flake with equivalent amounts of filler coating. The use of an ester acid coating on the silver results in lower composite thermal conductivity than using a long chain unsaturated fatty acid coating. However, the heterogeneous effect in the cured composite is still evident.

TABLE 6

The effect of filler coating amount on the thermal conductivity of heterogeneous composites containing fatty acid coated silver flake filled (33 vol %).

| Example[a] | Coating Amount $(mg/m^2)$[b] | Thermal Conductivity, k (W/m · K) |
|---|---|---|
| A-6 | Low | 25.6 |
| B-6 | Med | 23.0 |
| C-6 | High | 13.7 |

[a]Hetergeneous composites were formed from the reaction DGEBF (resin) and PAA(curative) in the presence of the silver flake.
[b]The flakes differ only in the amount of fatty acid coating.

TABLE 7

The effect of coating chemistry on the thermal conductivity of silver flake filled (25 vol %) DGEBF composites cured with PAA.

| Example | Coating Type on Silver Flake | Filler surface area $(m^2/g)$ | Coating Amount $(mg/m^2)$[a] | Thermal Conductivity, k (W/m · K) |
|---|---|---|---|---|
| A-7 | Long chain unsaturated fatty acid | 0.71 | 4.78 | 14.0 |
| B-7 | Ester acid | 0.66 | 4.24 | 10.9 |

[a]Determined by the ratio of filler surface area to that of the weight loss (mg organic/g silver) at 538° C. in air.

Example 7

Figure 10:
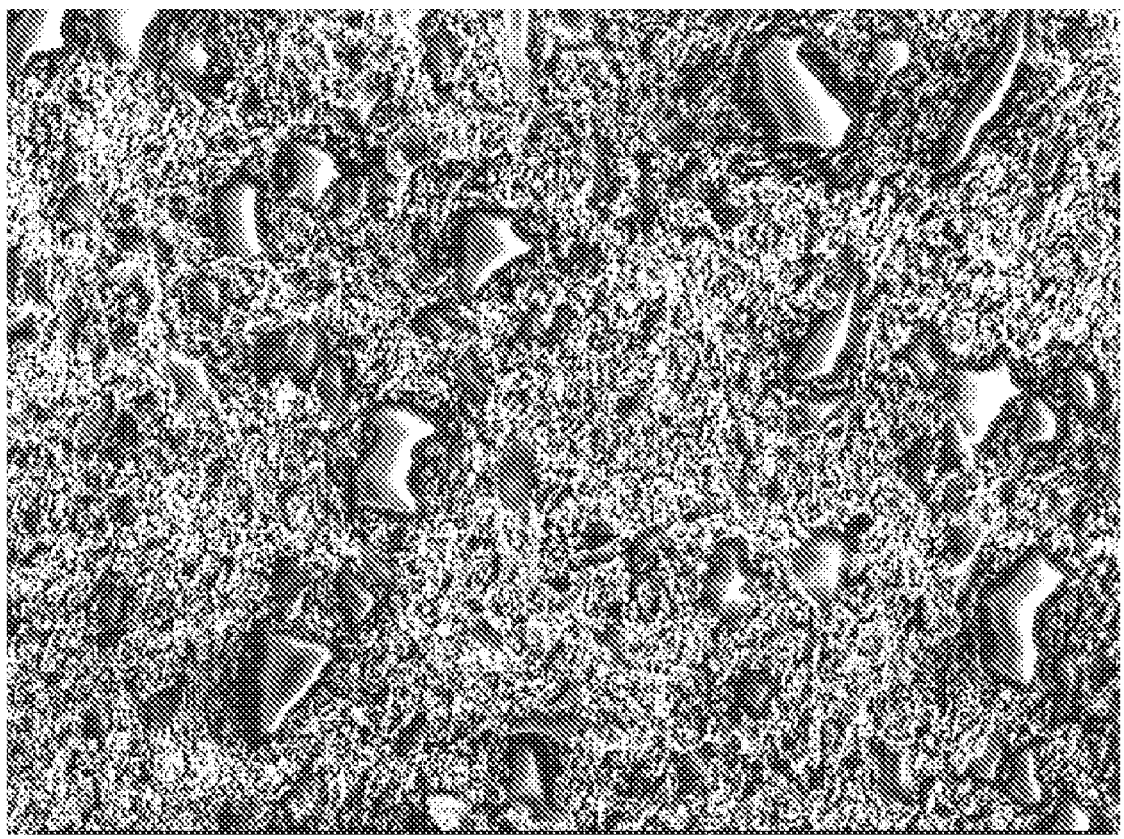
FIG. 10 A SEM photomicrograph showing a heterogeneous structure generated during the Michael's addition reaction between ethoxylated bisphenol A diacrylate and PAA cured at 200° C. (33 volume percent Ag flake filled) in an embodiment of the present invention.

Samples in Table 8 and FIG. 10 were mixed (uncured state) and characterized as outlined in Example 1. Each uncured sample was cast between 19 mm thick, Teflon coated aluminum plates separated with 1 mm glass slides as spacers. The Control, Examples 7-A and 7-B were cured with a convection oven using a programmed ramp which consisted of heating the sample from room temperature to 160° C. over the course of 40 minutes followed by an isothermal hold for 1 hour. Example 7-C was cured by heating the sample in a convection oven from room temperature to 200° C. (heating rate of approximately 40° C./min) and held at 200° C. The total cure time was 3 hours.

The chemical structure of organic components is another parameter affecting the extent heterogeneity in the structure formed during cure and the properties of the resulting composite. Table 8 provides examples of different types of resins (organic components) that produce heterogeneous structures when cured with PAA in the presence of stearic acid coated silver flake. A control sample possessing a homogeneous morphology provides a basis for reference. The thermal conductivity of heterogeneous examples relative to that of the control give an indication of extent of heterogeneity in composite structure upon curing. DGEBF when cured with PAA in the presence of silver results in about a 22 fold higher thermal conductivity relative to the homogeneous system. Similarly, an epoxy novolac cured with PAA results in a 16 fold difference in thermal conductivity relative to the homogeneous containing identical level (volume basis) of silver flake. Lastly, curing an ethoxylated bisphenol A diacrylate with PAA via a Michael's addition reaction results in a composite having over 6 times higher conductivity than that of the control. The SEM photomicrograph of Example 7-C shows that the heterogeneous structured during cure. As with previously in Example 1, the heterogeneous structure comprises discrete polymer rich domains (very light, globular regions) distributed throughout a continuous silver-rich phase.

TABLE 8

Heterogeneous structures from alternative resins

| Ingredient by wt % (vol %) | Control | Example 7-A | Example 7-B | Example 7-C |
|---|---|---|---|---|
| DGEBF | 8.27x | 13.4 | — | — |
| Epoxy novalac | — | — | 18.1 | — |
| Ethoxylated bishpenol A diacrylate | — | — | — | 13.0 |
| PAA | — | 4.6 | 6.9 | 4.8 |
| DETA | x | — | — | — |
| Silver flake[a] | 100-x | 82.0 (33) | 75.0 (25) | 82.2 (33) |
| Total | 100 | 100 | 100 | 100 |
| Cured Structure | Homogeneous | Heterogeneous | Heterogeneous | Heterogeneous |
| Thermal Conductivity, k (W/m · K) | See FIG. 4 | 22.3 | 13.1 | 6.5 |
| Ratio of k to $k_{Control}$ at same vol % Ag (See FIG. 4)[b] | 1.0 | 22 | 16 | 6.4 |

[a]Stearic acid coated silver flake (surface area = 0.83 m²/g, weight loss in air at 538° C. = 0.35%)
[b]Linear regression of the homogeneous data in Table 2 and FIG. 4 results in k = 0.0241 * (vol % Ag) + 0.211 with a goodness of fit $R^2$ = 0.96. This trend line provides a basis for comparison of thermal conductivity a homogeneous system (control) versus that of heterogeneous systems (Examples 7-A, B and C).

Although the present invention has been described with reference to particular embodiments, it should be recognized that these embodiments are merely illustrative of the principles of the present invention. Those of ordinary skill in the art will appreciate that the compositions, apparatus and methods of the present invention may be constructed and implemented in other ways and embodiments. Accordingly, the description herein should not be read as limiting the present invention, as other embodiments also fall within the scope of the present invention as defined by the appended claims.

What is claimed is:

1. A method for producing a composite comprising:
   a) selecting a reactive organic compound;
   b) selecting an inorganic filler component comprising a cold worked silver flake;
   c) mixing the reactive organic compound and the inorganic filler component, wherein at room temperature the organic compound and the filler component mix to form a substantially homogeneous structure having a bulk filler concentration; and,
   d) reacting the organic compound to form a polymer;
wherein the polymer has a repulsive interaction with the inorganic filler thereby creating, in situ, a heterogeneous structure comprising filler rich domains.

2. The method of claim 1, wherein the filler rich domains have a filler concentration which is higher than the bulk filler concentration.

3. The method of claim 1, wherein the reactive organic compound comprises at least one of monomers, oligomers, prepolymers, or reactive polymers.

4. The method of claim 3, wherein the organic compound further comprises a cure agent.

5. The method of claim 1, wherein the reaction of step d) is advanced by heating the mixture.

6. The method of claim 1, wherein the reaction of step d) is advanced by exposing the mixture to activating ultraviolet radiation.

7. The method of claim 1, further comprising a second filler component.

8. The method of claim 7, wherein the second filler component resides substantially with the polymer after the organic compound has been reacted.

9. The method of claim 1, wherein the inorganic filler component comprises an inorganic filler coated with an organic coating.

10. The method of claim 9, wherein the organic coating on the filler has an affinity for the reactive organic compound.

11. The method of claim 9, wherein the coating on the filler comprises stearic acid.

12. The method of claim 9, wherein the coating on the filler is present in a single layer as averaged over substantially all of the filler.

13. The method of claim 9, wherein the organic coating on the filler has a repulsive interaction with the polymer formed from the step of reacting the organic component.

14. The method of claim 9, wherein the coating on the filler comprises a non-polar coating.

15. The method of claim 1, wherein the polymer formed during step d) comprises polar moieties.

16. The method of claim 1, wherein the filler is thermally conductive.

17. The method of claim 1, wherein the filler is electrically conductive.

18. The method of claim 1, wherein the filler comprises solder.

19. The method of claim 1, wherein the filler comprises less than 75 percent by weight based on the total weight of the composition.

20. The method of claim 1, wherein the filler comprises less than 50 percent by volume based on the total volume of the composition.

21. The method of claim 1, wherein the filler comprises at metallic filler of at least one of nickel, copper, silver, palladium, platinum, gold, and alloys thereof.

22. The method of claim 1, wherein the filler comprises a sinterable filler.

23. The method of claim 22, further comprising the step of sintering the filler particles together.

24. The method of claim 23, wherein the step of sintering the filler particles together and the step of reacting the organic compound are performed simultaneously.

25. The method of claim 23, wherein the step of sintering is performed at a temperature above approximately 100° C.

26. The method of claim 23, wherein the step of sintering is performed at a temperature of above approximately 150° C.

27. The method of claim 23, wherein the sintering step is enhanced by an applied pressure on the composition.

28. The method of claim 23, wherein the degree of sintering is regulated through selection of sintering temperature and pressure.

29. The method of claim 22, wherein substantially all of the sinterable filler particles that are in direct contact with one another are sintered.

30. The method of claim 1, wherein the mixture of the reactive organic component and the filler is a solvent-free 100% solids composition.

* * * * *